United States Patent [19]
Jean et al.

[11] Patent Number: 5,141,899
[45] Date of Patent: Aug. 25, 1992

[54] LOW DIELECTRIC INORGANIC COMPOSITION FOR MULTILAYER CERAMIC PACKAGE CONTAINING TITANIUM SILICATE GLASS AND CRYSTAL INHIBITOR

[75] Inventors: Jau-Ho Jean, Export; Tapan K. Gupta, Monroeville, both of Pa.

[73] Assignee: Aluminum Company of America, Pittsburgh, Pa.

[21] Appl. No.: 749,679

[22] Filed: Aug. 26, 1991

[51] Int. Cl.$^5$ ............................................. C03C 8/20
[52] U.S. Cl. ........................................ 501/18; 156/89; 501/65; 501/134; 501/32
[58] Field of Search ............... 501/15, 16, 17, 18, 501/32, 65, 77, 134; 264/60, 61; 156/89

[56] References Cited

U.S. PATENT DOCUMENTS

| | | | |
|---|---|---|---|
| 4,642,148 | 2/1987 | Kurihara et al. | 156/89 |
| 4,672,152 | 6/1987 | Shinohara et al. | 174/68.5 |
| 4,755,490 | 7/1988 | DiLizzaro | 501/17 |
| 4,788,046 | 11/1988 | Barringer et al. | 423/122 |
| 4,879,261 | 11/1989 | Burn | 501/32 |
| 5,071,793 | 12/1991 | Jean et al. | 501/16 |

Primary Examiner—Karl Group
Assistant Examiner—Ghris Gallo
Attorney, Agent, or Firm—David W. Pearce-Smith

[57] ABSTRACT

A ceramic composition for forming a ceramic dielectric body having a dielectric constant of less than about 4.2 at 1 MHz and a linear thermal expansion coefficient of 2.5–3.0 ppm/°C. from room temperature to 200° C. The composition comprises a mixture of finely divided particles of 20–50 wt. % borosilicate glass, 40–75 wt. % titanium silicate glass and sufficient amounts of crystalline ceramic material to inhibit the formation of crystalline forms of silica. The composition can be used with a polymeric binder to produce an unfired green tape which is co-fireable with high conductivity metallurgies such as gold, silver and silver/palladium.

23 Claims, No Drawings

LOW DIELECTRIC INORGANIC COMPOSITION FOR MULTILAYER CERAMIC PACKAGE CONTAINING TITANIUM SILICATE GLASS AND CRYSTAL INHIBITOR

FIELD OF THE INVENTION

The invention relates to dielectric compositions. More particularly the invention relates to glass and ceramic materials that are sintered at low temperatures to produce dense bodies having low coefficients of thermal expansion and a dielectric constant below 4.2.

BACKGROUND OF THE INVENTION

Conventionally, alumina ($Al_2O_3$) is used as a dielectric material for microelectronic packages. It has excellent electrical (insulating), thermal and mechanical (especially strength) properties. Alumina based packages generally containing 4-10 wt. % glass require sintering temperatures above 1500° C., which necessitates the use of refractory metals such as molybdenum or tungsten for the electrical interconnections so that the metal can be co-fired with the package. These metals have poor electrical conductivity as compared to highly conductive metals such as copper, and secondly, they require the use of strongly reducing atmospheres during co-firing, necessitating expensive furnace systems.

The development of multilayer ceramic circuit boards is toward higher frequency, higher density and higher speed devices. $Al_2O_3$ has a relatively high dielectric constant of about 9.9, causing high signal propagation delay and low signal-to-noise ratio (crosstalk). The signal propagation delay (t) in ceramic substrates is affected by the effective dielectric constant of the substrate (k') according to the following equation:

$$t = (k')^{0.5}/C$$

where C is the speed of light. It can be found that the signal propagation delay can be dramatically reduced by a reduction in the effective dielectric constant of the substrate. For example, if the dielectric constant of a material is reduced from 10 (approximately the k' of $Al_2O_3$) to 5, the signal propagation delay can be reduced by 30%. A small signal delay is especially important for the substrate housing a chip with a very dense integrated circuit, for instance, very high speed integrated circuit.

Furthermore, alumina has a coefficient of thermal expansion of about $7.4 \times 10^{-6}$/°C. (in the 20°-200° C. range) as compared to $3.4 \times 10^{-6}$/°C. for silicon. This mismatch in thermal expansion results in design constraints and reliability concerns when attaching a silicon wafer to the substrate.

Heretofore, most of the dielectric materials used in multilayer circuits have been conventional thick film compositions. A typical circuit is constructed by sequentially printing, drying and firing functional thick film layers atop a ceramic substrate which is usually 92-96 wt. % $Al_2O_3$. The multiple steps required make this technology process intensive with the large number of process steps and yield losses contributing to high costs. Thick film technology nevertheless fills an important need in microelectronics and will continue to do so in the foreseeable future.

Recently, dielectric thick film compositions with low dielectric constants have been introduced. However, ceramic substrates with low dielectric constants less than 4.5 and thermal expansion coefficients equal to that of silicon (3.4 ppm/°C.) are not readily available.

Low temperature co fired (LTCF) technology has been recently introduced as a method for fabricating multilayer circuits. This technology offers the combination of the processing advantages of HTCF technology and the materials advantages of thick film technology. These LTCF tape systems have firing temperatures below 1000° C. and allow the use of high conductivity metals such as silver, gold, silver/palladium and copper (copper, however, requires reducing atmospheres). Most of these tape systems have dielectric constants between 6 and 8 and encompass a range of thermal coefficient of expansion (TCE).

Currently, we are not aware of any readily available low temperature co-fired dielectric tape system using a glass plus ceramic approach that offers both low dielectric constant (less than 4.5) and a TCE matched to silicon (3.4 ppm/°C.).

A method for producing a multilayer ceramic circuit board for use with copper conductors is described in U.S. Pat. No. 4,642,148 issued to Kurihara et al. Ceramic compositions comprising 10-75 wt. % alpha-alumina, 5-70 wt. % non-crystalline quartz (fused silica) and 20-60 wt. % borosilicate glass are disclosed. The dielectric constants of the fired materials ranged from 4.8 to 9.6.

U.S. Pat. No. 4,672,152 issued to Shinohara et al describes a multilayer ceramic circuit board in which the ceramic is prepared from a mixture of 50-95 wt. % crystallizable glass and 5-50 wt. % ceramic filler. The material has a dielectric constant between 5.1 and 6.0 and a flexural strength above 150 MPa. The crystallizable glass consists of 5-20 wt. % lithium oxide, 60-90 wt. % silicon dioxide, 1-10 wt. % aluminum oxide and 1-5 wt. % alkaline metal oxide other than lithium oxide. The ceramic filler is selected from the group of silicon dioxide, $\beta$-eucryptite ($LiAlSiO_4$) and aluminum oxide.

U.S. Pat. No. 4,755,490 issued to DiLazzaro describes a low firing temperature ceramic materials having dielectric constants between 4.5 and 6.1. The materials had coefficient of thermal expansion between 3.9 and 4.2 ppm/°C. $\times 10^{-6}$. Example 11 shows k'=4.5 and TCE=3.9. The material is formed from a mixture of 10-50 wt. % alumina, 0-30 wt. % fused silica and 50-60 wt. % (approximately 60-70 vol. %) of a frit composed of about 4 wt. % CaO, about 12 wt. % MgO, about 29 wt. % $B_2O_3$, and about 42 wt. % $SiO_2$. The compositions are fired at a temperature below 1000° C.

U.S. Pat. No. 4,788,046 issued to Barringer et al describes a glass-ceramic packages for integrated circuits having low sintering temperature. The sintered compositions are formed by coating ceramic particles with glass, separating the coated particles from the glass and then forming the coated particles into a green compact. The material with the lowest dielectric constant (4.5) is obtained using quartz. This material has a thermal expansion coefficient greater than 5.5.

U.S. Pat. No. 4,879,261 issued to Burn describes a low dielectric material having a dielectric less than 5.0. The material is formed from a mixture of finely divided particles consisting essentially of 70-85 wt. % silica and 15-30 wt. % zinc borax flux which is fired to 1065° C. in an oxidizing atmosphere. The composition can be used to make green tape and multilayer devices having internal copper conductors such as multilayer capacitors and multilayer interconnects.

From the foregoing, it can be seen that there is a substantial need for a low temperature co-fireable tape dielectric which (1) has a low dielectric constant (less than 4.5), (2) has a thermal expansion coefficient very close to the value for silicon (3.4 ppm/°C.), and (3) can be fired in air at a low temperature (less than 950° C.), thus permitting the use of high conductivity metallurgies such as gold, silver and silver/palladium.

The principal object of the invention is to provide a material that can be sintered into a body that has a dielectric constant of less than 4.2, a thermal expansion coefficient below 4.0 ppm/°C., and can be fired in air at temperatures less than 950° C.

Another object of the invention is to provide ceramic materials that are sintered at low temperatures to produce dense bodies (greater than 95% of theoretical density) having low coefficients of thermal expansion and a dielectric constant below 4.2 and have a glass content below 50 vol. %. A reduction in the glass content of the sintered body is very desirable in that the glassy phase is responsible for shape distortion or warpage during co-firing. If the sintered body is to be used in an electronic package, the shape distortion associated with high volume percent glass content can cause the via holes to misalign during co-firing of the metal and ceramic. A glass content below 50 vol. % will reduce the likelihood that warpage will occur.

SUMMARY OF THE INVENTION

The invention is directed to a ceramic composition for forming a ceramic dielectric body having a dielectric constant of less than about 4.2, the composition being co-fireable with high conductivity metals such as gold, silver and silver/palladium. The composition comprises a mixture of finely divided particles of 20-50 wt. % borosilicate glass, 50-75 wt. % titanium silicate glass and sufficient amounts of crystalline ceramic material to inhibit the formation of crystalline forms of silica. In a preferred embodiment the crystalline material is selected from the group of alumina, mullite, cordierite and combinations thereof.

The method of making a ceramic dielectric body of the present invention includes the steps of (a) providing a mixture consisting essentially of finely divided particles comprising 20-50 wt. % borosilicate glass, 50-75 wt. % titanium silicate glass and 1-40 wt. % of a material selected from the group of alumina, mullite, cordierite and combinations thereof; (b) casting said mixture to form green ceramic; and (c) sintering the mixture in air at a temperature not greater than about 1000° C.

In a second aspect, the invention is directed to an unfired green tape comprising the above composition dispersed in a polymeric binder.

In a further aspect, the invention is directed to a multilayer ceramic substrate comprising layers of the above composition and interconnected conductor layers of copper therebetween, the assemblage having been fired to form a dense hermetic structure. The multilayer ceramic circuit board is formed of a plurality of laminated ceramic circuit board units. Each unit includes a ceramic insulating layer, a patterned electrical conductor layer supported on the ceramic insulating layer and through hole electrical conductors for connecting the patterned electrical conductor layers of the respective ceramic circuit board units to form a predetermined wiring circuit. The electrical conductor layers and through hole electrical conductors are selected from the group of gold, silver and palladium. The ceramic insulating layer comprises a sintered mixture of 20-50 wt % borosilicate glass, 50-75 wt. % titanium silicate glass and sufficient amounts of crystalline ceramic material to inhibit the formation of crystalline forms of silica. In a preferred embodiment the crystalline material is selected from the group of alumina, mullite, cordierite and combinations thereof. The ceramic insulating layer is sintered at a temperature below the melting temperature of the patterned electrical conductor layers and the through hole electrical conductors.

In a yet another aspect, the invention is directed to a multilayer ceramic capacitor comprising layers of the above composition with conductor layers of copper therebetween, the assemblage having been fired to form a dense hermetic structure.

DETAILED DESCRIPTION OF THE PREFERRED EMBODIMENTS

The preferred glass plus ceramic composition of the present invention comprises a mixture of two principal ceramic/glass components: borosilicate glass and titanium silicate glass. The percentages of each component may be varied within the ranges delineated below, depending on the final desired properties of the fired ceramic material. Dense ceramic bodies can be formed from such compositions by normal manufacturing techniques and low temperature (i.e., 850°-1000° C.) sintering. A third component of the present invention is a crystalline ceramic material selected from the group of alumina, mullite, cordierite and combinations thereof. Although not wishing to be bound by any theory, it is believed that the third component acts to suppress the formation of crystalline forms of silica during the firing of the ceramic material.

In a preferred application of the invention, such a mixture is formed into a thin tape, via holes punched through the tape at desired locations, and one or more metal conductor paths are formed on the punched tape. Suitable metals for the conductor paths include copper, silver, gold, platinum/gold and palladium/silver. The tape is subsequently sintered at low temperature, typically after two or more sections have been laminated together to form a multilayer circuit substrate.

Surprisingly, it has been found that low firing temperature glass plus ceramic compositions can be made from mixtures containing less than 50 wt. % borosilicate glass. As stated above, a reduction in the glass content of the sintered body is very desirable in that the glassy phase is responsible for shape distortion or warpage during co-firing. A glass content below 50 wt. % will reduce the likelihood that warpage and misalignment of via holes will occur. Low firing temperature glass plus ceramic compositions of the invention are produced by providing a mixture of powdered ingredients, including 20-50 wt. % borosilicate glass and 50-75 wt. % titanium silicate glass. The borosilicate glass being composed of $Al_2O_3$, $B_2O_3$, $CaO$, $K_2O$, $Li_2O$, $Na_2O$ and $SiO_2$.

A quantity of the mixture is then formed into a desired shape using conventional procedures, and sintered at a temperature of at least 850° C., preferably 850°-950° C., and most preferably 900°-950° C. The sintering may be conducted in an oxidizing, neutral or reducing atmosphere.

The terms "ceramic" is used herein to describe inorganic compositions which do not soften at temperatures of less than about 1000° C.

The term "glass" is used herein to describe compositions which melt and form a glassy phase at temperature of less than about 1000° C.

The term "glass plus ceramic" is used herein to describe a sintered composition which is formed from a mixture of ceramic and glass. The ceramic and glass phases of the "glass plus ceramic" composition remain distinct after firing. The glass in a "glass plus ceramic" system retains its glassy characteristic after firing and is said to be a non-crystallizable glass in that composition. The ceramic in a "glass plus ceramic" system need not be a crystalline material; it may also be a glass.

The ceramic, whether glassy or crystalline in nature, does not soften during sintering and retains its initial characteristic after firing and is said to behave as a ceramic in that fired composition. The term "glass plus ceramic" is used herein to distinguish systems containing non-crystallizable glasses from "glass-ceramic" systems in which the glass undergoes a controlled devitrification during firing and becomes crystalline.

The term "borosilicate glass" is used herein to describe a family of glasses containing 20-35 wt. % boron oxide ($B_2O_3$) and 60-80 wt. % silicon oxide ($SiO_2$).

The term "titanium silicate glass" is used herein to describe a family of glasses containing 80-99 wt. % silicon oxide ($SiO_2$) and 1-20 wt. %. "Titanium silicate glass" has a softening point of about 1400°-1500° C. depending on its composition. Since the "titanium silicate glass" does not soften when fired to temperatures below about 1000° C., it can therefore be said to behave like a crystalline filler. Thus, the use of "titanium silicate glass" will not contribute to shape distortion or warpage during co-firing. As stated above, the shape distortion associated with high volume percent glass content can cause the via holes in the electronic package to misalign during co-firing of the metal and ceramic.

In addition to the "titanium silicate glass" being refractory, it does not normally devitrify when used in a ceramic composition which is fired below 1000° C. In this regard, "titanium silicate glass", which usually contains about 93 wt. % $SiO_2$, is different from "fused silica glass" which is virtually 100% $SiO_2$.

The cristobalite and quartz phases formed during firing remain on cooling. Cristobalite has a TCE of about $50 \times 10^{-6}$/°C. (in the 20°-300° C. range) and quartz has a TCE of about $13 \times 10^{-6}$/°C. as compared to $3.5 \times 10^{-6}$/°C. for silicon. The presence of cristobalite and/or quartz in the fired product raises the TCE and lowers the mechanical strength of the product. The loss of mechanical strength is due to the volume change associated with phase transformation which generates microcracks. "Titanium silicate glass" will not normally form cristobalite crystallites when it is fired to temperatures below about 1000° C.

The term "finely divided" is used herein to describe a material that is ground to less than about 5 microns in size.

The term "crystalline ceramic material" is used herein to describe a family of refractory ceramic materials containing low levels of elements selected from Group IA of the periodic table. The term "crystalline ceramic material" is intended to include, but is not limited to alumina ($Al_2O_3$), barium oxide (BaO), cordierite ($Mg_2Al_4Si_5O_{18}$), magnesium oxide (MgO), titania ($TiO_2$), mullite ($Al_6Si_2O_{13}$), magnesium titanate ($MgTiO_3$), spinel ($MgAl_2O_4$), forsterite ($2MgO.SiO_2$), steatite ($MgO.Si_2$), aluminum phosphate ($AlPO_4$), aluminum titanate ($Al_2TiO_5$), dolomite ($CaCO_3.MgCO_3$), anorthite ($CaO.Al_2O_3 2SiO_2$), wollastonite ($CaSiO_3$), talc ($Mg_3Si_4O_{10}(OH)_2$), sillmanite ($Al_2SiO_5$), silicon nitride ($Si_3N_4$), aluminum oxynitride (AlON), $CaZrO_3$, AlN, $ZnO.SiO_2$, $ZrO_2$ and $ZrO_2.SiO_2$. The term "crystalline ceramic material" is not intended to include the various crystalline forms of silica ($SiO_2$) which include quartz, tridymite, flint and cristobalite. As stated above the crystalline phases of silica, such as quartz and cristobalite, remain in the material during firing and on cooling and their presence in the fired product raises the TCE and lowers the mechanical strength of the product. Linear thermal expansion coefficients for polymorphoric forms of silica and glasses are shown in Table 1.

TABLE 1

| Composition | Thermal Coefficient of Expansion | | | |
|---|---|---|---|---|
| | 20-100° C. | 20-200° C. | 20-300° C. | 20-600° C. |
| Quartz | 11.2 | — | 13.2 | 23.7 |
| Cristobalite | 12.5 | — | 50.0 | 27.1 |
| Tridymite | 17.5 | — | 25.0 | 14.4 |
| Fused Silica Glass | — | 0.5 | — | — |
| High Silica Glass | — | 0.7 | — | — |
| Borosilicate Glass | — | 3.3 | — | — |
| Titanium silicate Glass | — | 0.5 | — | — |

The glasses can be prepared by conventional glass-making techniques by mixing the desired components in the desired proportions and heating the mixture to form melt. As is well known in the art, heating is conducted to a peak temperature and for a time such that the melt becomes entirely liquid and homogeneous.

The above-described glasses are particularly desirable for use in electronic packages, such as VLSI applications, because of their low polarizability and thus low dielectric constant. Because borosilicate glasses by themselves tend to have low softening points, it is necessary to increase the softening point by the addition of large amounts of a other glasses which have high $SiO_2$ concentrations. Titanium silicate glasses are more durable than those with high $B_2O_3$ concentrations.

A preferred borosilicate glass comprises about 0-1 wt. % $Al_2O_3$, 25-30 wt. % $B_2O_3$, 0-1 wt. % CaO, 0-1 wt. % $K_2O$, 0-1 wt. % $Li_2O$, 0-1 wt. % $Na_2O$, 0-0.5 wt. % $ZnO.B_2O_3$ and 65-75 wt. % $SiO_2$. The amount of borosilicate glass used affects the sintering temperature. If too little borosilicate glass is used (for example, less than about 20 wt. % in this embodiment), the sintering temperature will be too high to achieve the benefits of the present invention. Maintaining the proportion of borosilicate glass within the range of about 20-50 wt. % is necessary to obtain these benefits.

A preferred titanium silicate glass composition is sold under the trade name Corning 7971 and contains 7 wt. % $TiO_2$ and 93 wt. % $SiO_2$. Corning 7971 glass is not currently available as a finely divided powder and it will need to be ground according to well established grinding (also called "milling") techniques known in the art. One such method of grinding is "ball milling" and it may be performed dry or by forming a slurry.

The following examples illustrate preferred ranges of components of the glass plus ceramic compositions of the invention. In each example, the borosilicate glass is comprised of 0.98 wt. % $Al_2O_3$, 26.7 wt. % $B_2O_3$, 0.11 wt. % CaO, 0.84 wt. % $K_2O$, 0.78 wt. % $Li_2O$, 0.2 wt.

% Na$_2$O and 69.8 wt. % SiO$_2$ and the titanium silicate glass is Corning's 7971.

EXAMPLE 1

In this example, the starting materials consisted essentially of 53 wt. % titanium silicate glass, 38 wt. % borosilicate glass and 9 wt. % of alumina (Al$_2$O$_3$). The borosilicate glass and the titanium silicate glass are separately ground in a 1.3 gallon ball mill for 16 hours to achieve an average particle size of about 2–4 microns.

The mixture is combined with 5 wt. % polyethylene glycol binder and 50 wt. % 1-propanol and mixed for 2 hours in a tubular mixer. The material is then oven dried at 80° C. for 2 hours and screened. The material is then dry pressed into 1.9 cm diameter, 0.3 cm high pellets by compressing the milled mixture in a mold at 13,000 psi (910 kg/cm$^2$).

The pellets are divided into three groups prior to firing in air. The first group (A) is to be fired at 900° C., the second group (A) is to be fired at 925° C., and the third group (C) is to be fired at 950° C. The firing is in two steps. The first step is to burn the binder out. This is accomplished by heating the pellets to 500° C. and holding for 1 hour. Next, the pellets are sintered isothermally at their respective temperatures (as identified above) ranging from 900° C. to 950° C. for four hours.

The sintered density of the sintered materials are determined by the water replacement method, according to ASTM procedure C373-72. The sintered density of the material of Example 1 as well as subsequent examples is recorded in Table 2. The sintered density is the average of density of the pellets and it is reported as the percentage of theoretical density, which is calculated based upon mixing rule. It is found that the resulting sintered ceramic material is always less than 95% theoretical density (T.D.) at temperatures ranging from 900° to 950° C. X-ray analysis showed only a nominal amount of crystalline phases of silica present in the sintered body.

Dielectric constant and dielectric loss are determined by an HP 4192 AC impedance at 1 MHz. The dielectric constants are also recorded in Table 2.

Thermal expansion coefficients (TCE) are determined in the temperature ranges from room temperature (RT) to 200° C. and RT-450° C. using a dilatometer. TCE's are recorded in Table 2.

TABLE 2

| Example | Firing Temp. | Density (% TD) | k' | TCE (ppm/°C.) (RT-200° C.) | TCE (ppm/°C.) (RT-450° C.) |
| --- | --- | --- | --- | --- | --- |
| 1A | 900° C. | 88.9 | — | — | — |
| 1B | 925° C. | 94.5 | — | — | — |
| 1C | 950° C. | 97.5 | 4.09 | 2.99 | 2.63 |
| 2A | 900° C. | 95.2 | — | — | — |
| 2B | 925° C. | 97.2 | — | — | — |
| 2C | 950° C. | 98.6 | 4.12 | 2.69 | 2.45 |
| 3A | 900° C. | 90.6 | — | — | — |
| 3B | 925° C. | 94.2 | — | — | — |
| 3C | 950° C. | 98.3 | 4.27 | 3.10 | 2.65 |

EXAMPLE 2

The procedure of Example 1 repeated except that the inorganic composition was 49.7 wt. % titanium silicate glass, 38.8 wt. % borosilicate glass and 11.5 wt. % cordierite (Mg$_2$Al$_4$Si$_5$O$_{18}$). The material was divided into three groups (2A, 2B and 2C) and fired at 900° C., 925° C. and 950° C. The sintered density, dielectric constant and thermal expansions of the material are reported in Table 2. The resulting sintered ceramic compacts have a density greater than 95% theoretical density (T.D.) at temperatures greater than 900° C. X-ray analysis showed only a nominal amount of crystalline phase of silica present in the sintered body.

EXAMPLE 3

The procedure of Example 1 repeated except that the inorganic composition was 48.5 wt. % titanium silicate glass, 38.0 wt. % borosilicate glass and 13.5 wt. % mullite (Al$_6$Si$_2$O$_{13}$). The material was divided into three groups (3A, 3B and 3C) and fired at 900° C., 925° C. and 950° C. The sintered density, dielectric constant and thermal expansions of the material is reported in Table 2. The resulting sintered ceramic compacts have a density greater than 94% theoretical density (T.D.) at temperatures greater than 925° C. X-ray analysis showed only a nominal amount of crystalline phase of silica present in the sintered body.

The products of Examples 1–3 contain a low "glass" content (40 wt. %) which is much less than those reported in the literature (greater than 60 wt. %). The titanium silicate glass used in the examples has a softening point of about 1500° C. Since the titanium silicate glass does not soften when fired to temperatures below about 1000° C., it can therefore be said to behave like a crystalline filler. Thus, the use of "titanium silicate glass" will not contribute to shape distortion or warpage during co-firing. As stated above, the shape distortion associated with high volume percent glass content can cause the via holes in the electronic package to misalign during co-firing of the metal and ceramic.

The products of Examples 1–3 had high sintered densities (greater than 94% of the theoretical density) obtained at temperatures of 900°–950° C. in air. The sintering temperatures of the materials of Examples 1–3 are compatible with those of precious metals, e.g., Au and Ag-Pd, which will enable the compositions to be utilized in a co-firable ceramic/metal electronic packaging system. In addition, the material of Examples 1–3 exhibited low dielectric constants (4.1–4.3) which are very desirable to reduce the signal propagation delay in the ceramic substrate.

The materials of Examples 1–3 can be used to form multilayer high frequency circuit packages. To form dielectric layers for multilayer high frequency circuit packages, the starting materials are ground in a ball mill until they have an average particle size of about 2–4 microns. A slurry is then formed by combining the finely ground powder with a suitable solvent and other conventional additives, such as a plasticizer and a binder, in a manner known in the art. The slurry is cast into thin "green" (unfired) sheets having a thickness of about 75 to 400 microns using a conventional doctor blading process, after which the green sheets are blanked into individual 125 mm square sheets or tapes.

Via holes next are formed in the green sheets by a die punching process. The holes suitably may have a diameter of about 125 microns. A conductor paste is applied in a desired pattern to the punched sheets using a screen printing process. The paste is also applied within the via holes to form connections between conductor patterns. The principal metallic constituent of the paste may be gold, silver, copper, silver/palladium alloy, gold/platinum alloy, or other suitable materials. The printed green sheets are then stacked in a desired sequence using alignment holes to insure correct positioning, and laminated together at 50°-100° C. under a pressure between about 35 and 250 kg/cm².

Finally, the laminated green sheets are fired at a temperature not exceeding 1000° C. to form dense, sintered ceramic multilayer circuit substrates. The firing may be done in air if the conductor metal is not susceptible to oxidation at the firing temperature. Such is the case, for example, with the metals named above, except for copper, which requires a reducing or neutral atmosphere. Sheets formed in the manner described will have a lower glass content (25-50 vol. %) and therefore a lower tendency to bow or warp.

The compositions of the present invention also can be used to form rigid, nonporous ceramic bodies by substantially conventional techniques. For example, the batch ingredients of any of the previous examples are combined with water and organic binders, and ball milled for a period of about 20 hours. The resulting slurry is spray dried to provide a powder of substantially spherical particles. This powder can be used to form bodies of various desired shapes by standard forming techniques, such as dry or isostatic pressing. The bodies are then fired at a suitable temperature not exceeding 1000° C. to provide dense, sintered ceramic objects.

It will be apparent to those skilled in the relevant art that various changes and modifications may be made in the embodiments described above to achieve the same or equivalent results without departing from the principles of the present invention as described and claimed herein. All such changes and modifications are intended to be covered by the following claims.

What is claimed is:

1. A dielectric composition formed from a mixture comprising:
   (a) 20-50 wt. % borosilicate glass;
   (b) 40-70 wt. % titanium silicate glass; and
   (c) sufficient amounts of crystalline ceramic material to inhibit the formation of crystalline forms of silica.

2. The dielectric composition of claim 1 in which said titanium silicate glass comprises 45-55 wt. % of said dielectric composition.

3. The dielectric composition of claim 1 in which said crystalline ceramic material is 1-40 wt. % of a crystalline aluminosilicate.

4. The dielectic composition of claim 1 in which said crystalline material is 1-40 wt. % of a material selected from the group of alumina, cordierite, mullite, magnesia, spinel, forsterite, steatite, aluminum phosphate (AlPO$_4$), aluminum nitride, aluminum titanate, barium oxide, titania, magnesium titanate, dolomite, anorthite, wollastonite, talc, sillmanite, silicon nitride, aluminum oxynitride, CaZrO$_3$, ZnO.SiO$_2$, ZrO$_2$ and ZrO$_2$.SiO$_2$.

5. The dielectric composition of claim 1 in which the borosilicate glass comprises:
   19-30 wt. % B$_2$O$_3$;
   60-80 wt. % SiO$_2$;
   0.1-4 wt. % CaO;
   0.1-4 wt. % Al$_2$O$_3$; and
   0.1-4 wt. % selected from the group of K$_2$O, Li$_2$O, Na$_2$O and mixtures thereof.

6. The dielectric composition of claim 1 in which the titanium silicate glass comprises 80-99 wt. % SiO$_2$ and 1-20 wt. % TiO$_2$.

7. The dielectric composition of claim 1 in which the mixture is dispersed in an organic medium.

8. A castable ceramic composition comprising:
   (a) 70-85 wt. % of a mixture comprising:
      20-50 wt. % borosilicate glass;
      40-75 wt. % titanium silicate glass; and sufficient amounts of crystalline ceramic material to inhibit the formation of crystalline forms of silica; and
   (b) 15-30 wt. % of an organic medium comprised of a polymeric binder dissolved in an organic solvent.

9. A method of making a ceramic dielectric body comprising the steps of:
   (a) providing a mixture comprising:
      20-50 wt. % borosilicate glass;
      40-75 wt. % titanium silicate glass; and
      sufficient amounts of crystalline ceramic material to inhibit the formation of crystalline forms of silica; and
   (b) sintering said mixture in air to a temperature not greater than about 1000° C.

10. The ceramic composition of claim 8 in which the borosilicate glass comprises:
    19-30 wt. % B$_2$O$_3$;
    60-80 wt. % SiO$_2$;
    0.1-4 wt. % CaO,;
    0.1-4 wt. % Al$_2$O$_3$; and
    0.1-4 wt. % selected from the group of K$_2$O, Li$_2$O, Na$_2$O and mixtures thereof.

11. The ceramic composition of claim 8 in which the titanium silicate glass comprises 80-99 wt. % SiO$_2$ and 1-20 wt. % TiO$_2$.

12. A multilayer ceramic module formed of a plurality of laminated ceramic units, at least one said unit including a ceramic insulating layer, a patterned electrical conductor layer supported on said ceramic insulating layer and electrical conductors for connecting said patterned electrical conductor layers of said ceramic module to form a predetermined wiring circuit, said electrical conductor layers and said electrical conductors selected from the group consisting of gold, silver and palladium, said ceramic insulating layer comprising a product formed from a mixture comprising:
   (a) 20-50 wt. % borosilicate glass;
   (b) 40-75 wt. % titanium silicate glass; and
   (c) sufficient amounts of crystalline ceramic material to inhibit the formation of crystalline forms of silica;

said ceramic insulating layer sintered at a temperature below the melting temperature of said patterned electrical conductor layers and said electrical conductors.

13. The multilayer ceramic module of claim 12 in which the borosilicate glass comprises:
    19-30 wt. % B$_2$O$_3$;
    60-80 wt. % SiO$_2$;
    0.1-4 wt. % CaO;
    0.1-4 wt. % Al$_2$O$_3$; and
    0.1-4 wt. % selected from the group of K$_2$O, Li$_2$O, Na$_2$O and mixtures thereof.

14. The multilayer ceramic of claim 12 in which the titanium silicate glass comprises 80-99 wt. % SiO$_2$ and 1-20 wt. % TiO$_2$.

15. The multilayer circuit of claim 12 in which said crystalline material is 1-40 wt. % of a crystalline alumino-silicate.

16. The multilayer ceramic circuit of claim 12 in which said crystalline material is 1-40 wt. % of a material selected from the group of alumina, cordierite, mullite, magnesia, spinel, forsterite, steatite, aluminum phosphate (AlPO$_4$), aluminum nitride and aluminum titanate, barium oxide, titania, magnesium titanate, dolomite, anorthite, wollastonite, talc, sillmanite, silicon nitride, aluminum oxynitride, $CaZrO_3$, $ZnO.SiO_2$, $ZrO_2$ and $ZrO_2.SiO_2$.

17. A dielectric composition formed from a mixture comprising:
(a) 20-50 wt. % borosilicate glass comprising:
  19-30 wt. % $B_2O_3$;
  60-80 wt. % $SiO_2$;
  0.1-4 wt. % CaO;
  0.1-4 wt. % $Al_2O_3$; and
  0.1-4 wt. % selected from the group of $K_2O$, $Li_2O$, $Na_2O$ and mixtures thereof;
(b) 40-70 wt. % titanium silicate glass comprising:
  80-99 wt. % $SiO_2$ and
  1-20 wt % $TiO_2$; and
(c) 1-40 wt. % of a material selected from the group of alumina, cordierite, mullite, magnesia, spinel, forsterite, steatite, aluminum phosphate ($AlPO_4$), aluminum nitride and aluminum titanate, barium oxide, titania, magnesium titanate, dolomite, anorthite, wollastonite, talc, sillmanite, silicon nitride, aluminum oxynitride, $CaZrO_3$, $ZNO.SiO_2$, $ZrO_2$ and $ZrO_2.SiO_2$.

18. A dielectric composition formed from a mixture comprising:
(a) 20-50 wt. % borosilicate glass;
(b) 40-70 wt. % titanium silicate glass; and
(c) 1-40 wt. % of a material selected from the group of alumina, cordierite, mullite, magnesia, spinel, forsterite, steatite, aluminum phosphate ($AlPO_4$), aluminum nitride and aluminum titanate, barium oxide, titania, magnesium titanate, dolomite, anorthite, wollastonite, talc, sillmanite, silicon nitride, aluminum oxynitride, $CaZrO_3$, $ZnO.SiO_2$, $ZrO_2$ and $ZrO_2.SiO_2$;
said dielectric composition containing less than 5 wt. % of crystalline forms of silica.

19. The dielectric composition of claim 18 in which said amount of crystalline forms of silica is less than 1 wt. %.

20. A dielectric composition formed from a mixture comprising:
(a) 20-50 wt. % borosilicate glass comprising:
  19-30 wt. % $B_2O_3$;
  60-80 wt. % $SiO_2$;
  0.1-4 wt. % CaO:
  0.1-4 wt. % $Al_2O_3$; and
  0.1-4 wt. % selected from the group of $K_2O$, $Li_2O$, $Na_2O$ and mixtures thereof;
(b) 40-70 wt. % titanium silicate glass comprising:
  80-99 wt. % $SiO_2$ and
  1-20 wt. % $TiO_2$; and
(c) 1-40 wt. % of a material selected from the group of alumina, cordierite, mullite, magnesia, spinel, forsterite, steatite, aluminum phosphate ($AlPO_4$), aluminum nitride and aluminum titanate, barium oxide, titania, magnesium titanate, dolomite, anorthite, wollastonite, talc, sillmanite, silicon nitride, aluminum oxynitride, $CaZrO_3$, $ZrO_2$ and $ZrO_2.SiO_2$;
said dielectric composition containing less than 5 wt. % of crystalline forms of silica.

21. A method of making a multilayer ceramic module comprising the steps of:
(a) providing a mixture of comprising:
  20-50 wt. % borosilicate glass;
  40-75 wt. % titanium silicate glass; and
  sufficient amounts of crystalline ceramic material to suppress the formation of crystalline forms of silica to less than 5 wt. % during firing of said composition;
(b) forming green tape using said mixture;
(c) cutting said green tape into sheets;
(d) forming via holes in said sheets;
(e) forming patterns of electrically conductive paste on said sheet;
(f) laminating a plurality of said sheets;
(g) firing said laminated sheets to a temperature below the melting point of said conductive paste.

22. A method of claim 21 in which step (e) comprises screening metallic paste formed from materials selected from the group consisting of gold, silver, copper, silver/palladium alloy, gold/platinum alloy and combinations thereof.

23. A method of claim 21 in which step (g) comprises firing said laminated sheets to a temperature not greater than about 1000° C.

* * * * *

UNITED STATES PATENT AND TRADEMARK OFFICE
CERTIFICATE OF CORRECTION

PATENT NO. : 5,141,899

DATED : August 25, 1992

INVENTOR(S) : Jau-Ho Jean and Tapan K. Gupta

It is certified that error appears in the above-identified patent and that said Letters Patent is hereby corrected as shown below:

Col. 10, line 56　　　After "ceramic", insert --module--.
Claim 14

Col. 10, line 59　　　After "multilayer", delete "circuit" and insert
Claim 15　　　　　　therefor --ceramic module--.

Col. 10, line 62　　　After "ceramic", delete "circuit" and insert
Claim 16　　　　　　therefor --module--.

Col. 12, line 15　　　After $CaZrO_3$,", insert --$ZnO \cdot SiO_2$--.
Claim 20

Signed and Sealed this

Fourth Day of January, 1994

Attest:

BRUCE LEHMAN

Attesting Officer　　　Commissioner of Patents and Trademarks